United States Patent
Gupta et al.

(10) Patent No.: US 8,229,727 B2
(45) Date of Patent: Jul. 24, 2012

(54) SYSTEM AND METHOD FOR INCORPORATING DESIGN BEHAVIOR AND EXTERNAL STIMULUS IN MICROPROCESSOR EMULATION MODEL FEEDBACK USING A SHARED MEMORY

(75) Inventors: Sanjay Gupta, Austin, TX (US); Joseph Anthony Perrie, III, Austin, TX (US); Steven Leonard Roberts, Cedar Park, TX (US); Todd Swanson, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 709 days.

(21) Appl. No.: 11/621,335

(22) Filed: Jan. 9, 2007

(65) Prior Publication Data

US 2008/0167854 A1 Jul. 10, 2008

(51) Int. Cl.
*G06F 9/455* (2006.01)
(52) U.S. Cl. .............................. 703/23; 714/34; 717/124
(58) Field of Classification Search .................... 703/23, 703/27, 26, 14; 716/5, 4, 1, 103, 106; 324/752; 717/124; 714/742, 34; 709/224; 707/100
See application file for complete search history.

(56) References Cited

U.S. PATENT DOCUMENTS

| | | | |
|---|---|---|---|
| 2003/0061341 A1* | 3/2003 | Loh et al. ..................... | 709/224 |
| 2003/0131325 A1* | 7/2003 | Schubert et al. ................ | 716/4 |
| 2004/0017213 A1* | 1/2004 | Witte ............................ | 324/752 |
| 2004/0168137 A1* | 8/2004 | Baumgartner et al. .......... | 716/5 |
| 2004/0250191 A1* | 12/2004 | Learning ....................... | 714/742 |
| 2004/0254779 A1* | 12/2004 | Wang et al. .................... | 703/27 |
| 2005/0102125 A1* | 5/2005 | Tseng ............................ | 703/14 |
| 2005/0229121 A1* | 10/2005 | Hildebrant ..................... | 716/4 |
| 2005/0267730 A1* | 12/2005 | Kfir et al. ...................... | 703/26 |
| 2005/0289396 A1* | 12/2005 | Hooper et al. ................. | 714/34 |
| 2006/0015313 A1* | 1/2006 | Wang et al. .................... | 703/14 |
| 2006/0117274 A1* | 6/2006 | Tseng et al. .................... | 716/1 |
| 2006/0195311 A1* | 8/2006 | Swoboda et al. ............... | 703/26 |
| 2006/0195822 A1* | 8/2006 | Beardslee et al. ............. | 717/124 |
| 2007/0038433 A1* | 2/2007 | Swoboda ....................... | 703/23 |
| 2009/0119310 A1* | 5/2009 | Larue et al. ................... | 707/100 |

FOREIGN PATENT DOCUMENTS

CN 1725188 1/2006

OTHER PUBLICATIONS

Li et al., "Design and Implementation of a CPU Chip Hardware Test and Debug Platform," Journal of Computer Research and Development, vol. 40, No. 6, Jun. 2003, pp. 884-888.

* cited by examiner

*Primary Examiner* — Kandasamy Thangavelu
(74) *Attorney, Agent, or Firm* — VanLeeuwen & VanLeeuwen; Matthew B. Talpis

(57) ABSTRACT

A system and method for incorporating design behavior and external stimulus in microdevice model feedback using a shared memory is presented. The invention describe herein uses the attached memory model to provide additional heuristics to an application executing on an emulation system's device model, which results in a more detail and real-life device emulation. The attached memory model provides a storage area for a runtime software environment to store emulation data, which is subsequently provided to the device model during emulation. The emulation data may include 1) randomization stimuli to the device model, 2) additional runtime data for checking heuristics, and 3) emulation data points that are otherwise not accessible to the device model.

15 Claims, 9 Drawing Sheets

SYSTEM AND METHOD FOR INCORPORATING DESIGN BEHAVIOR AND EXTERNAL STIMULUS IN MICROPROCESSOR EMULATION MODEL FEEDBACK USING A SHARED MEMORY

BACKGROUND OF THE INVENTION

1. Technical Field

The present invention relates to a system and method for incorporating design behavior and external stimulus in microprocessor emulation model feedback using a shared memory. More particularly, the present invention relates to a system and method for providing additional heuristics to an application executing on a device model during emulation, which results in a more detailed and real-life device emulation.

2. Description of the Related Art

Contemporary processors are complex integrated circuit systems that consist of millions of transistors. Two typical approaches to test these devices are to 1) use a general-purpose computer to simulate the device, and 2) use an emulator, which is a specific-purpose machine, to test the device's design logic.

A challenge found with using a general-purpose computer for simulation is that the simulation takes an enormous amount of time due to the device's complexity. Therefore, much of the device is not tested prior to fabrication due to schedule constraints.

A challenge found with using an emulator to test the device's design logic is that emulators are not able to test the physical operation of the device in great detail. For example, emulation systems have long operation periods where the emulation system is not able to poll data from the device under test. As a result, sophisticated buffering schemes are implemented such that the emulation runtime software performs checks during intervals when the device under test is not cycled.

What is needed, therefore, is a system and method to test a device's complex design logic in an efficient and effective manner prior to fabrication.

SUMMARY

It has been discovered that the aforementioned challenges are resolved using a system and method for using an attached memory model to provide additional heuristics to an application executing on a device model during emulation, which results in a more detailed and real-life device emulation. The attached memory model provides a storage area for a runtime software environment to store emulation data, which is subsequently provided to the device model during emulation. The emulation data may include 1) randomization stimuli to the device model, 2) additional runtime data for checking heuristics, and 3) emulation data points that are otherwise not accessible to the device model during emulation.

To begin the emulation process, an emulation system loads and initializes the attached memory model and the device model. The runtime software environment then loads the exerciser application into the attached memory model, which executes within the device model during emulation.

The runtime software environment begins clocking the attached memory model and the device model in order for the exerciser application to execute a number of instructions. After a particular number of clock cycles, the runtime software environment stops clocking and reads emulation data from the device model, which is a result from the exerciser application's instruction execution. The emulation data may include detail information pertaining to latches and modeled signals within the device model.

Once the runtime software environment reads the emulation data, the runtime software environment stores the emulation data in the attached memory model and begins re-clocking the attached memory model and the device model. This re-clocking allows the exerciser application to process the emulation data stored in the attached memory model.

In one embodiment, the runtime software environment loads seed data into the attached memory model, which the exerciser application uses to seed a random generator. This embodiment provides additional randomization stimulus to the device model, allowing for a greater degree of emulation compared to using a mathematically determinate state machine.

In another embodiment, the runtime software environment may store external stimuli data in the attached memory model, which is subsequently processed by the exerciser application. This embodiment may be used for purposes such as lighthouse checking, which are points in a program's execution from which multiple paths are explored. When a program reaches a lighthouse position, the invention described herein provides external stimuli that simulates input streams, such as keystrokes and/or mouse clicks.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

The following is intended to provide a detailed description of an example of the invention and should not be taken to be limiting of the invention itself. Rather, any number of variations may fall within the scope of the invention, which is defined in the claims following the description.

Figure 1:
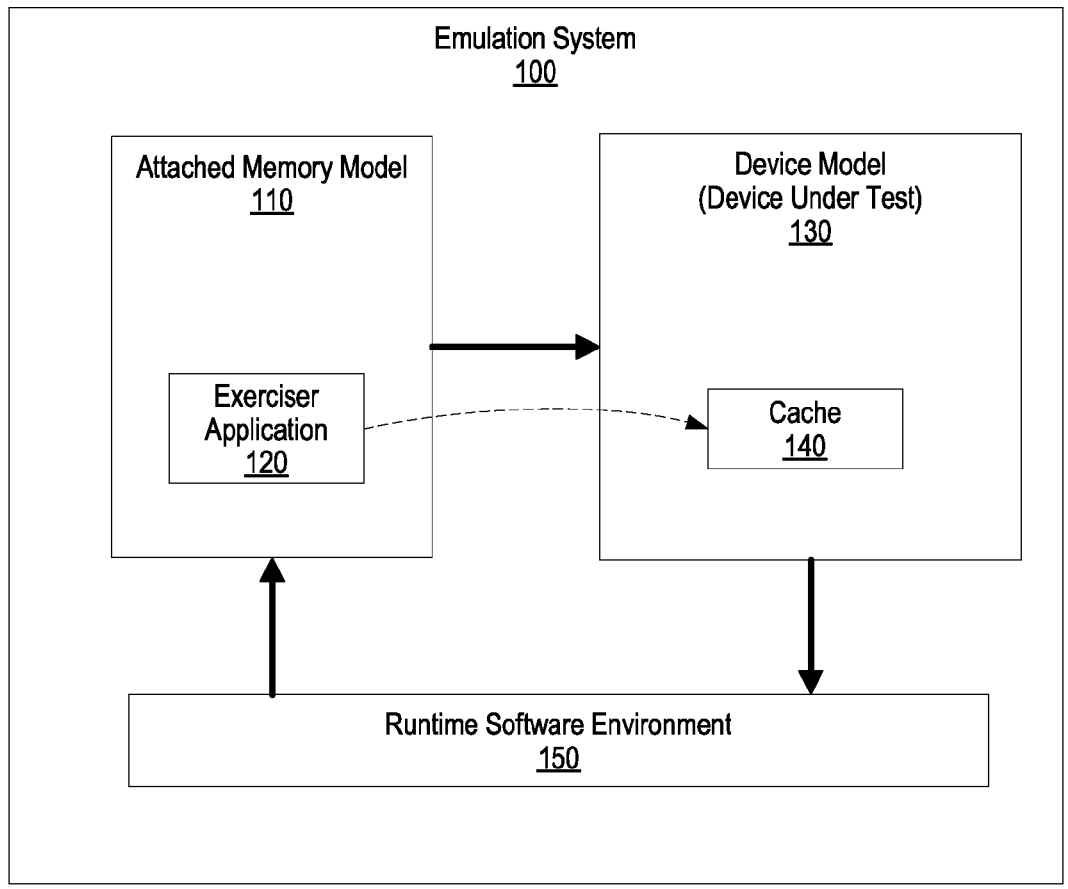
FIG. 1 is a diagram showing an emulation system using an attached memory model for providing emulation data to a device model.

FIG. 1 is a diagram showing an emulation system using an attached memory model for providing emulation data to a device model. Emulation system 100 includes device model 130, runtime software environment 150, and attached memory model 110. Attached memory model 110 provides a storage area for runtime software environment 150 to store the emulation data, which is subsequently provided to device model 130 during emulation. The emulation data may include 1) randomization stimuli to device model 130, 2) additional runtime data for checking heuristics, and 3) emulation data points that are otherwise not accessible to device model 130. Device model 130 is a model that represents a device such as a microprocessor or digital signal processor.

To begin the emulation process, emulation system 100 loads and initializes attached memory model 110 and device model 130. Runtime software environment 150 then loads exerciser application 120 into attached memory model that, during emulation, executes on device model 130 within cache 140.

Runtime software environment 150 begins clocking attached memory model 110 and device model 130 in order for exerciser application 120 to execute a number of instructions. After a particular number of clock cycles, runtime software environment 150 stops clocking and reads emulation data from device model 130 that resulted from exerciser application 120's instructions. The emulation data may include information pertaining to each latch and modeled signal within device model 130.

Once runtime software environment 150 reads the emulation data, runtime software environment 150 stores the emulation data in attached memory model 110 and begins clocking attached memory model 110 and device model 130 again. This clocking allows exerciser application 120 to process the emulation data stored in attached memory model 110.

Figure 2:
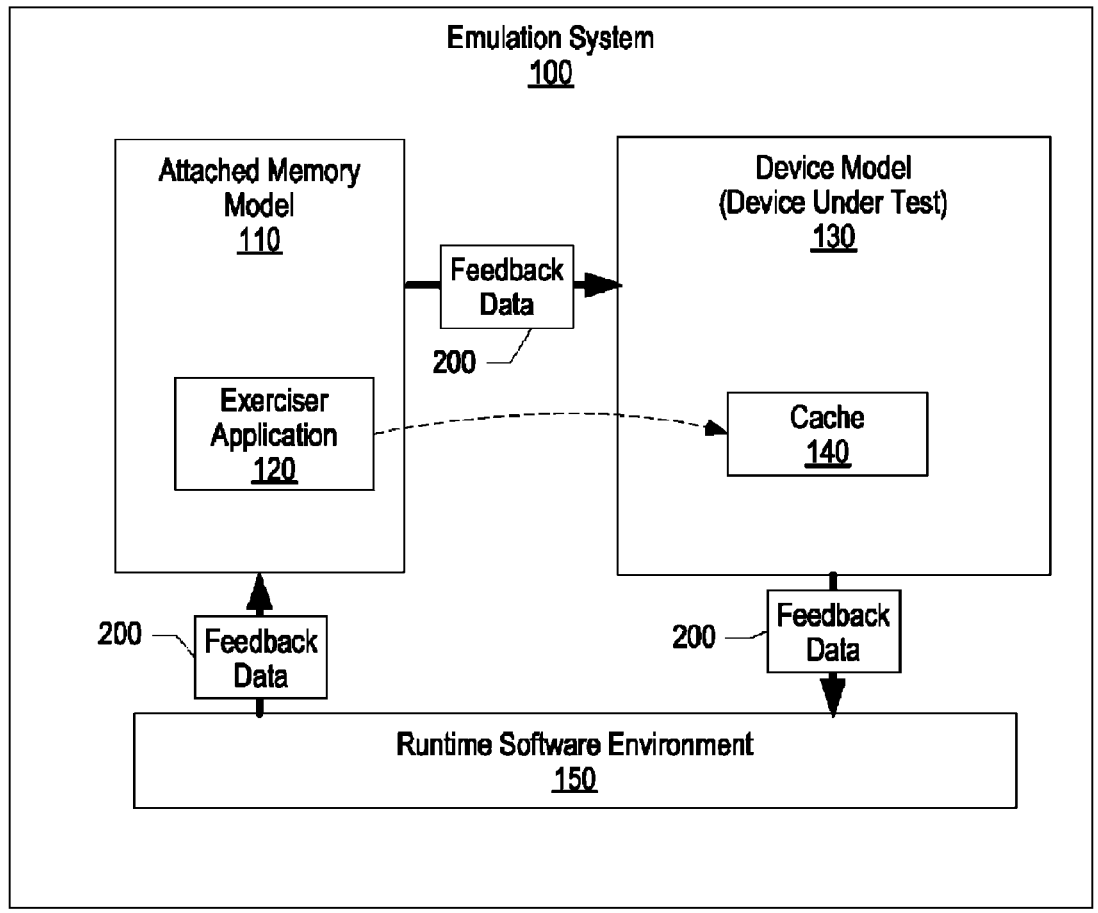
FIG. 2 is a diagram showing an emulation system providing emulation feedback data from an attached memory model to a device model during device emulation.

FIG. 2 is a diagram showing an emulation system providing emulation feedback data from an attached memory model to a device model during device emulation. Emulation system 100 includes runtime software environment 150, device 130, and attached memory model 110. Runtime software 150 loads exerciser application 120 into attached memory model 110. During emulation, exerciser application 120 executes on device model 130 within cache 140.

Runtime software environment 150 then clocks attached memory model 110 and device model 130 in order for exerciser application 120 to execute. After a particular number of clock cycles, runtime software 150 stops model clocking, and reads feedback data 200 from device model 130, which includes model state, cycle statistics, and other relevant data that exerciser application 120 collects. Runtime software environment 150 then stores feedback data 200 in attached memory model 110.

Once feedback data 200 is stored in attached memory model 110, runtime software environment 150 begins model re-clocking, which allows exerciser application 120 to read feedback data 200 from attached memory model 110. Runtime software environment 150 continues to read and store feedback data 200 until emulation terminates (see FIG. 5 and corresponding text for further details). Emulation system 100, attached memory model 110, exerciser application 120 device model 130, cache 140, and runtime software environment 150 are the same as that shown in FIG. 1.

Figure 3:
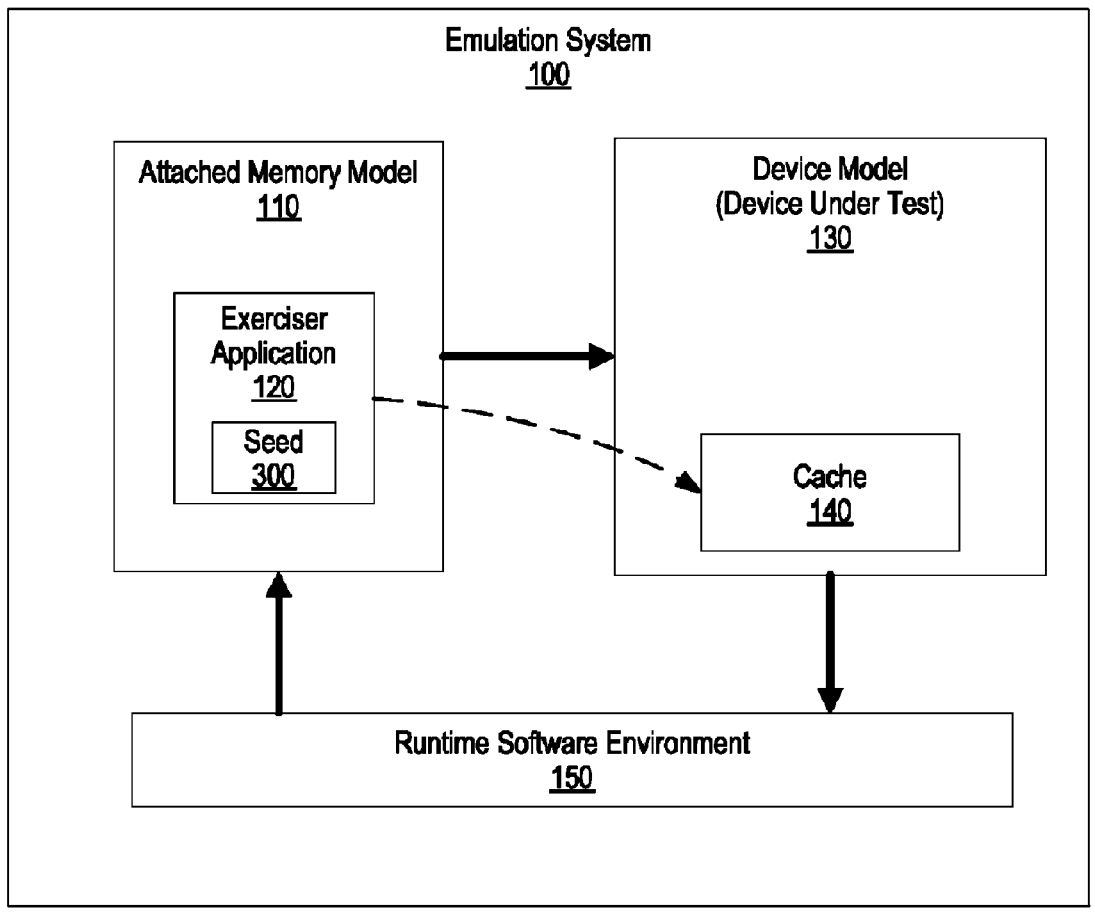
FIG. 3 is a diagram showing an emulation system providing seed data from an attached memory model to a device model during device emulation.

FIG. 3 is a diagram showing an emulation system providing seed data from an attached memory model to a device model during device emulation. Emulation system 100 includes runtime software environment 150, device 130, and attached memory model 110. Runtime software 150 loads exerciser application 120 and seed data 300 into attached memory model 110. During emulation, exerciser application 120 executes on device model 130 and uses seed data 300 to load a random generator. As a result, seed data 300 provides additional randomization stimulus that allows for a greater degree of emulation as opposed to using a mathematically determinate state machine (see FIG. 6 and corresponding text for further details). Emulation system 100, attached memory model 110, exerciser application 120 device model 130, cache 140, and runtime software environment 150 are the same as that shown in FIG. 1.

Figure 4:
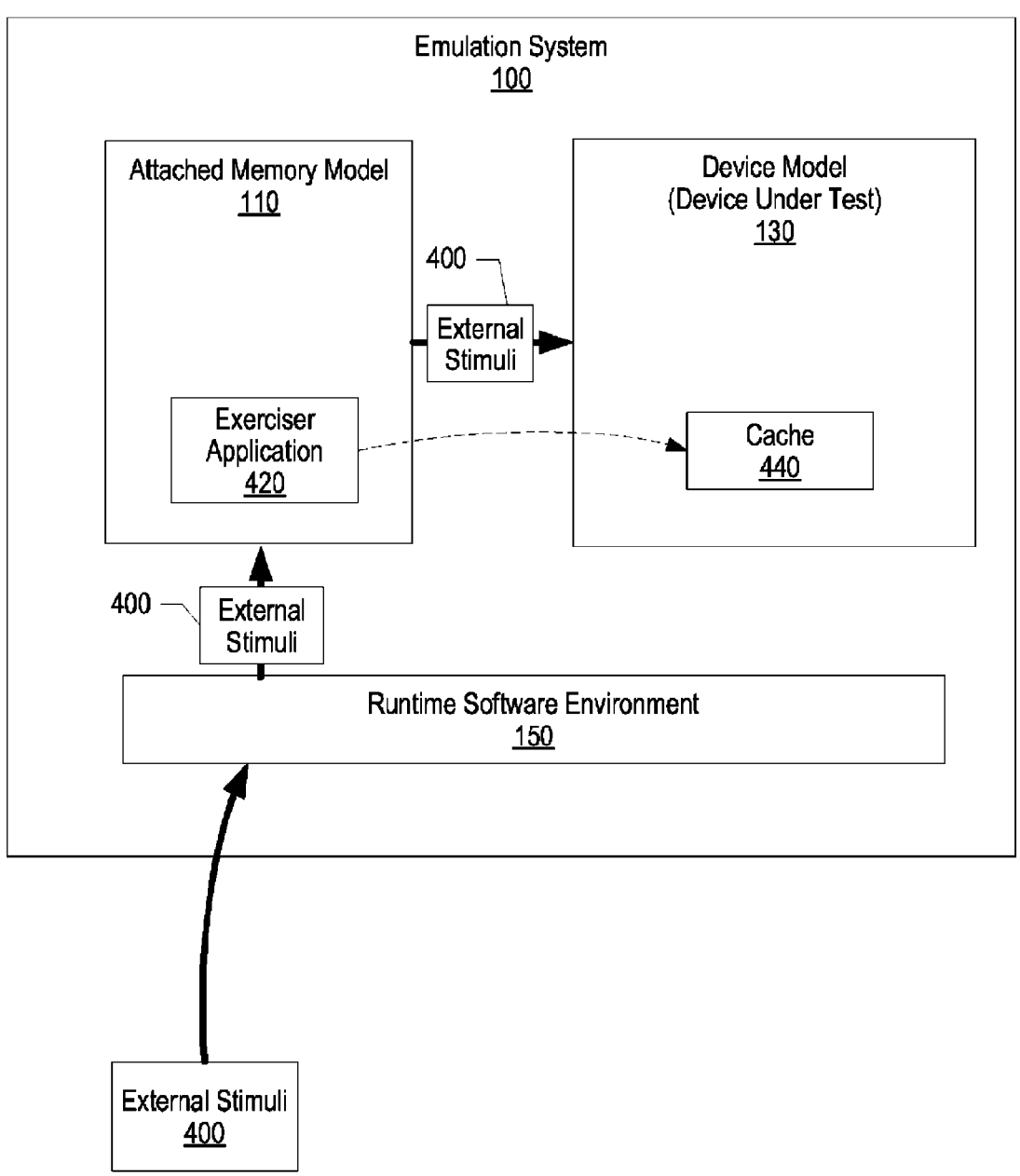
FIG. 4 is a diagram showing an emulation system providing external stimuli data from an attached memory model to a processor model during processor emulation.

FIG. 4 is a diagram showing an emulation system providing external stimuli data from an attached memory model to a processor model during processor emulation. This embodiment may be used for purposes such as lighthouse checking, which are points in a program's execution from which multiple paths are explored. When a program reaches a lighthouse position, the invention described herein provides external stimuli that simulates input streams, such as keystrokes and/or mouse clicks.

Emulation system 100 includes runtime software environment 150, device 130, and attached memory model 110. During emulation, exerciser application 120 executes on device model 130 within cache 120 to check heuristics of device model 130. When exerciser application 120 encounters a lighthouse position, runtime software environment 150 receives external stimuli 400, stores it in attached memory model 110, which is then accessed by exerciser application 120.

In one embodiment, runtime software environment 150 may programmatically examine the possibility of completing execution paths within a given cycle time interval when exerciser application 120 reaches a lighthouse position. In this embodiment, an interrupt routine may be added to a test application that reads a cycle count from attached memory model 110 in order to determine whether exerciser application 120 should continue with the current execution stream. For example, external stimuli 400 may simulate human interaction with an operating system command line interface. At each lighthouse condition, different paths are chosen at random via external stimuli 400 in order to simulate typical real world operation of the device.

In another embodiment, runtime software environment 150 may poll thermal noise off an actual microprocessor for a true source of randomness. These values are then stored in attached memory model 110 and provided to device model 130 (see FIG. 6 and corresponding text for further details). Emulation system 100, attached memory model 110, exerciser application 120 device model 130, cache 140, and runtime software environment 150 are the same as that shown in FIG. 1.

Figure 5:
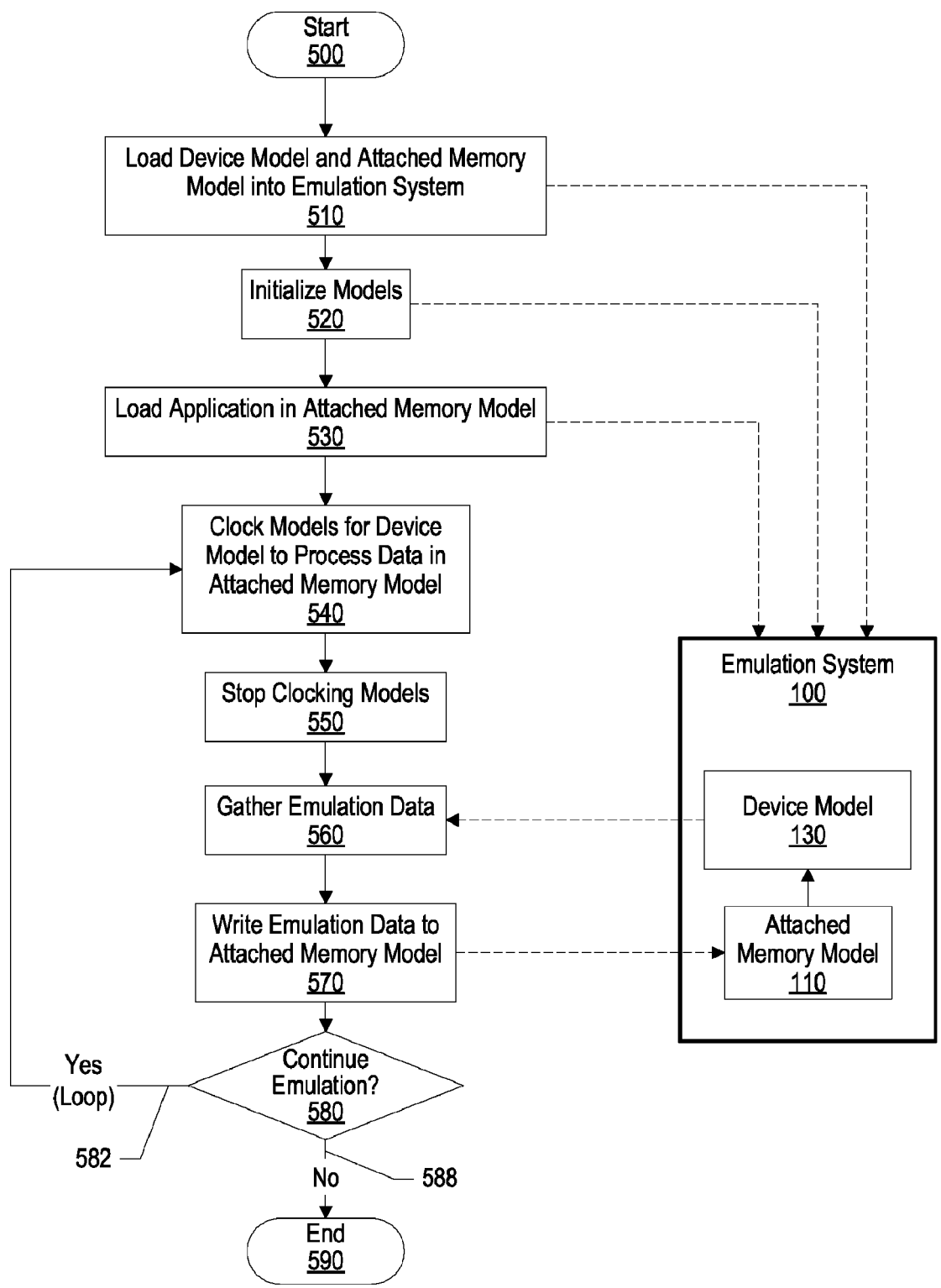
FIG. 5 is a flowchart showing steps taken in using an attached memory model to store and provide emulation feedback data to a device model during emulation.

FIG. 5 is a flowchart showing steps taken in using an attached memory model to store and provide emulation feedback data to a device model during emulation. Processing commences at 500, whereupon processing loads device model 130 and attached memory model 110 into emulation system 100 at step 510. Device model 130 emulates a device, such as a microprocessor, and attached memory model 110 stores and provides emulation data to device model 130. Emulation system 100, device model 130, and attached memory model 110 are the same as that shown in FIG. 1.

Processing, at step 520, initializes device model 130 and attached memory model 110 and, once initialized, processing loads an exerciser application into attached memory model 110, such as exerciser application 120 shown in FIG. 1 (step 530). At step 540, processing clocks device model 130 and attached memory model 110 a particular number of clock cycles, which allows the exerciser application to retrieve and process emulation data from attached memory model 110. Processing stops model clocking at step 550 and, at step 560, processing gathers feedback data from device model 130 that resulted from the clocking process at step 550. At step 570, processing writes the feedback data to attached memory model 110, which is input to device model 130 during subsequent device model clocking steps (step 550 above).

A determination is made as to whether to continue emulation (decision 580). If processing should continue emulation, decision 580 branches to "Yes" branch 582, which loops back to continue to clock device model 130, and gather more feedback data. This looping continues until processing should terminate emulation, at which point decision 580 branches to "No" branch 588, whereupon processing ends at 590.

Figure 6:
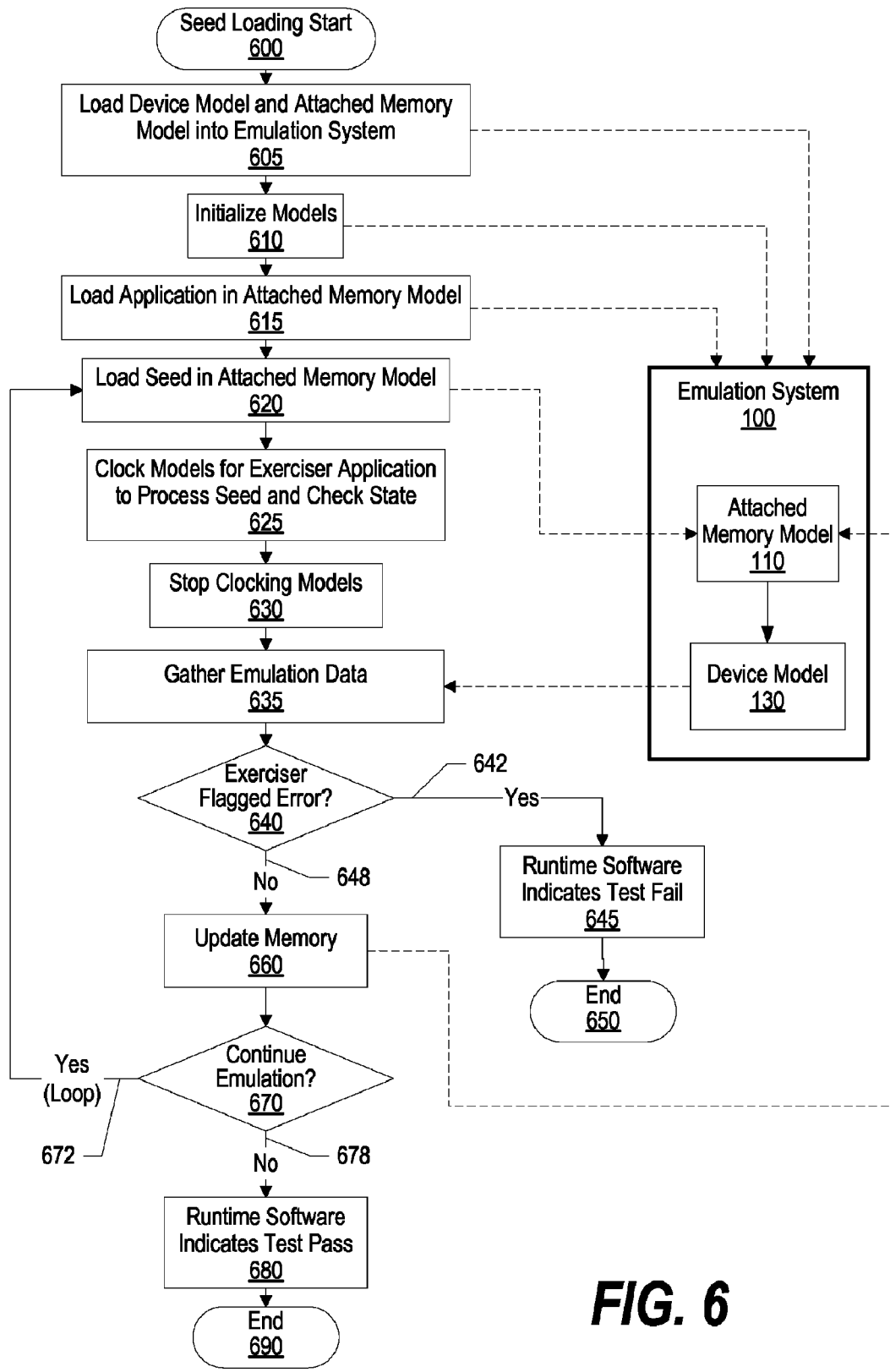
FIG. 6 is a flowchart showing steps taken in using an attached memory model to store and provide seed data to a processor model during emulation.

FIG. 6 is a flowchart showing steps taken in using an attached memory model to store and provide seed data to a processor model during emulation. An exerciser application uses the seed data for seeding a random generator, which allows a greater breadth of emulation.

Processing commences at 600, whereupon processing loads device model 130 and attached memory model 110 into emulation system 100 at step 605. Emulation system 100, device model 130, and attached memory model 110 are the same as that shown in FIG. 1. At step 610, processing initializes device model 130 and attached memory model 110 and, once initialized, processing loads an exerciser application into attached memory model 110, such as exerciser application 120 shown in FIG. 1 (step 615).

At step 620, processing loads seed data (e.g., a randomized value) into attached memory model. Once the seed data is loaded, processing clocks device model 130 and attached memory model 110 a particular number of clock cycles, which allows the exerciser application to process the seed data and check the state of device model 130 (step 625). Processing stops model clocking at step 630 and, at step 635, processing gathers emulation data from device model 130 that includes the states of device model 130.

A determination is made as to whether the emulation data includes an exerciser application flagged error (decision 640). For example, the operating system may fail or subsequent system calls from a test may be performed incorrectly. If the emulation data includes an exerciser application flagged error, decision 640 branches to "Yes" branch 642 whereupon processing indicates an emulation test failure (step 645), and processing ends at 650.

On the other hand, if the emulation data does not include an exerciser application flagged error, decision 640 branches to "No" branch 648 whereupon processing updates attached memory model 110 with the emulation data.

A determination is made as to whether processing should continue emulation (decision 670). If processing should continue emulation, decision 670 branches to "Yes" branch 672, which loops back to continue clocking the models and analyzing device model 130's state. This looping continues until processing should terminate emulation, at which point decision 670 branches to "No" branch 678, whereupon processing indicates an emulation test pass (step 680), and processing ends at 690.

Figure 7:
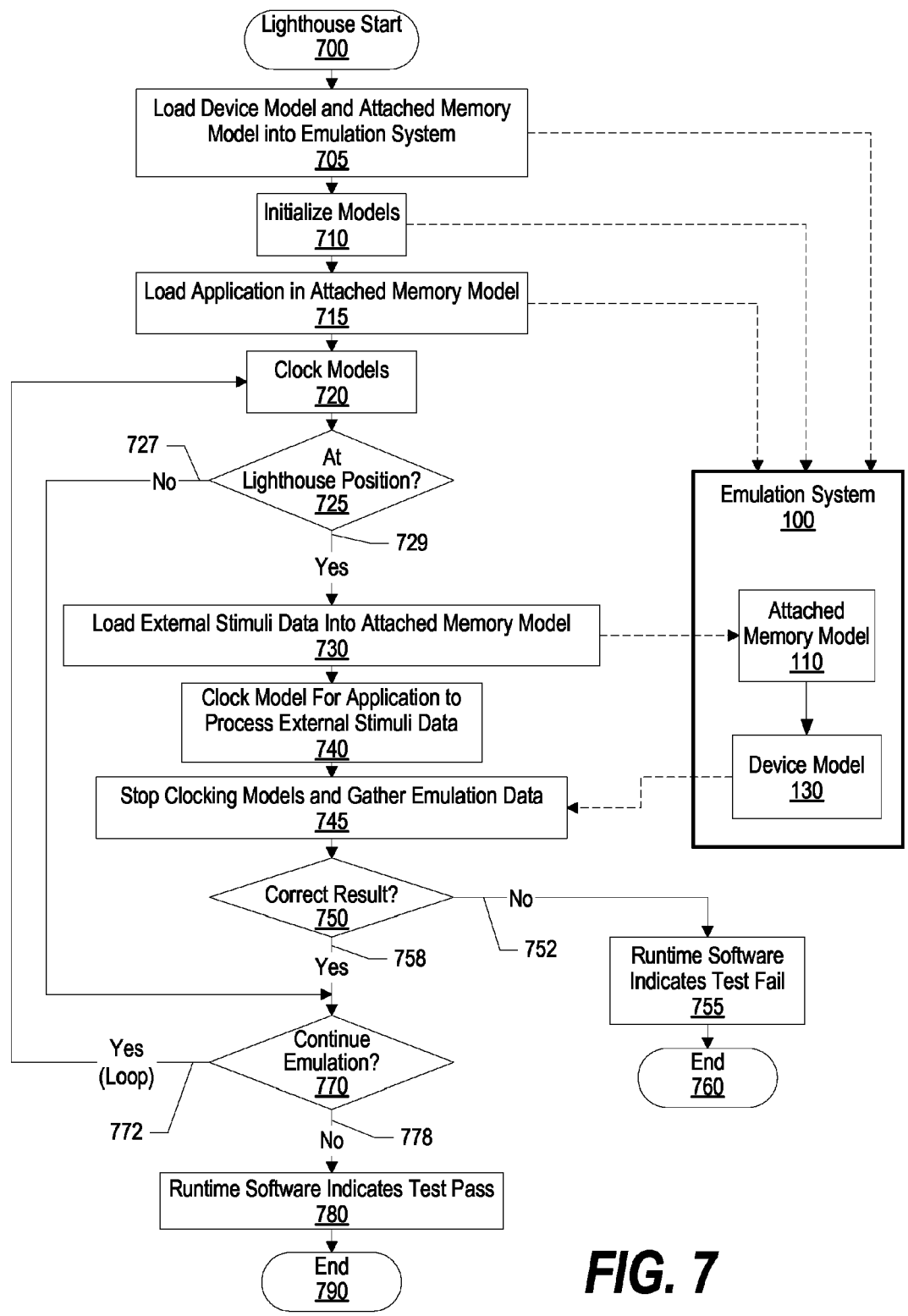
FIG. 7 is a flowchart showing steps taken in using an attached memory model to provide external stimuli data to a processor model during emulation.

FIG. 7 is a flowchart showing steps taken in using an attached memory model to provide external stimuli data to a processor model during emulation. For example, when an emulation encounters a point in a program from which multiple paths are explored (i.e. lighthouse), the invention described herein provides external stimuli that simulate input streams, such as keystrokes and/or mouse clicks.

Processing commences at 700, whereupon processing loads device model 130 and attached memory model 110 into emulation system 100 at step 705. Emulation system 100, device model 130, and attached memory model 110 are the same as that shown in FIG. 1. At step 710, processing initializes device model 130 and attached memory model 110 and, once initialized, processing loads an exerciser application into attached memory model 110, such as exerciser application 120 shown in FIG. 1 (step 715).

Processing proceeds to clock device model 130 and attached memory model 110 in order for the exerciser application to execute a number of instructions (step 720). A determination is made as to whether the exerciser application has reached a lighthouse position (decision 725). If the exerciser application has not reached a lighthouse position, decision 725 branches to "No" branch 727 bypassing external stimuli injection steps.

On the other hand, if the exerciser application has reached a lighthouse position, decision 725 branches to "Yes" branch 729 whereupon processing loads external stimuli data into attached memory model 110 at step 730. At step 740, processing resumes model clocking in order for the exerciser application to process the external stimuli data. After a particular number of clock cycles, processing stops clocking the models and gathers emulation data (step 745).

A determination is made as to whether the emulation data includes a "correct result" (decision 750). A correct result is a pre-computed value or a return code that the exerciser application calculates based upon the external stimuli data, such as checking for a return code of 0. For example, if Linux is the exerciser application, the external stimuli data may be "test $(echo 1+1|bc)=2," which is fed into a command interpreter. This example tests to verify that the "bc" executable calculates that 1+1=2. The result of this test should be a return code 0 if correct. In one embodiment, a runtime software environment and the exerciser application may independently verify each check to insure correctness.

If the emulation data does not include a correct result, decision 750 branches to "No" branch 752 whereupon processing indicates an emulation test failure (step 755) and processing ends at 760. On the other hand, if the emulation data includes a correct result, decision 750 branches to "Yes" branch 758 whereupon a determination is made as to whether to continue the emulation (decision 770). If processing should continue emulation, decision 770 branches to "Yes" branch 772, which loops back to continue clocking device model 130 and injecting external stimuli data. This looping continues until processing should terminate emulation, at which point decision 770 branches to "No" branch 778 whereupon processing indicates an emulation test pass at step 780, and processing ends at 790.

Figure 8:
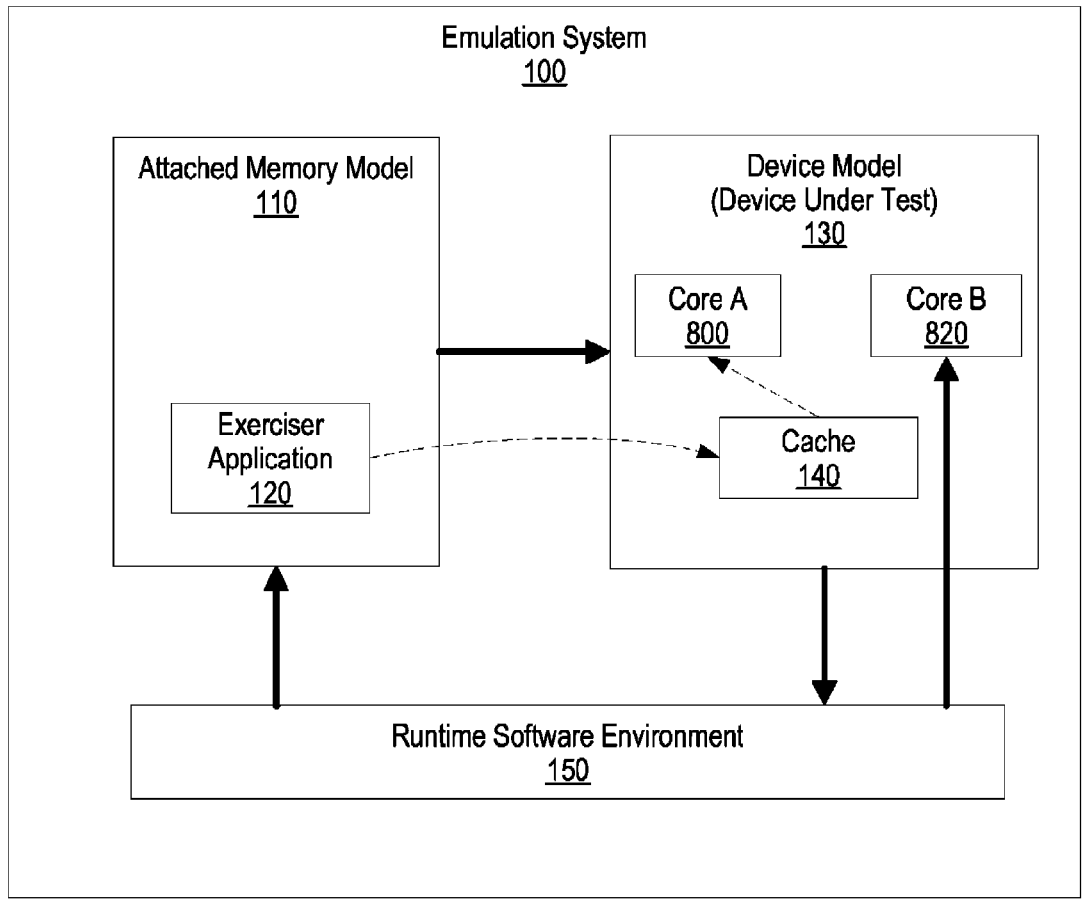
FIG. 8 is a diagram showing an emulation system emulating a multi-processor device.

FIG. 8 is a diagram showing an emulation system emulating a multi-processor device. Emulation system 100 includes runtime software environment 150, device 130, and attached memory model 110. Device model 130 includes two cores, which are core A 800 and core B 820. In this embodiment, core A 800 is under emulation using exerciser application 120 that executes within cache 140. Emulation system 100, attached memory model 110, device model 130, cache 140, and runtime software environment 150 are the same as that shown in FIG. 1.

During emulation, core B 820 monitors emulator-specific heuristics that are not available to core A 800 itself, such as cycle times, low-level TTL latch data, and in-flight sniffed bus transactions. This allows core A 800 to execute original, unmodified application code. As such, non-application related code is separated and run on a distinct processor so as to not alter the operation of the original application code (exerciser application 120). In one embodiment, this "hybrid-checking" methodology may be used to develop an extensive set of invariant and incremental checking heuristics.

Figure 9:
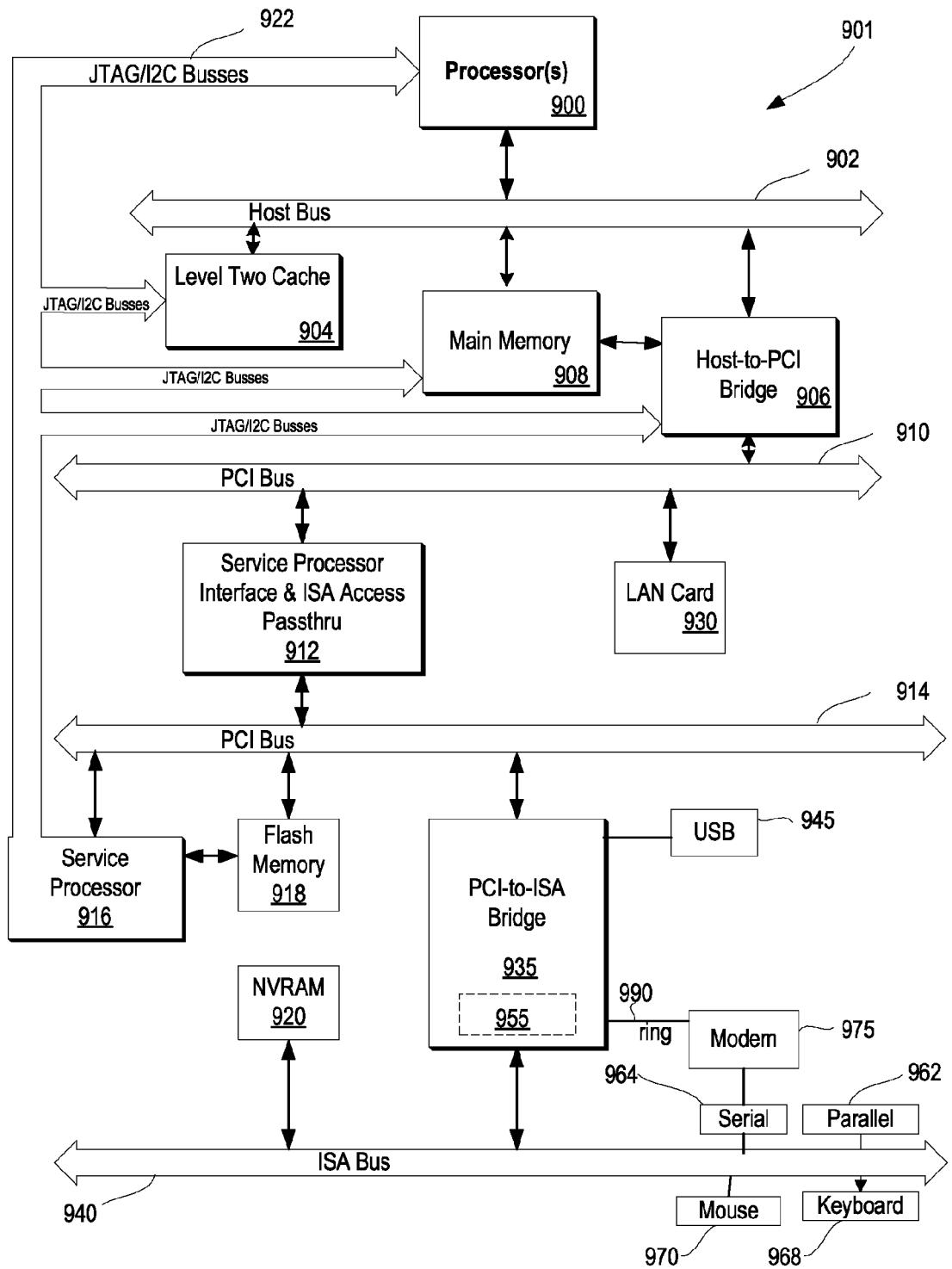
FIG. 9 is a block diagram of another computing device capable of implementing the present invention.

FIG. 9 illustrates information handling system 901 which is a simplified example of a computer system capable of performing the computing operations described herein. Computer system 901 includes processor 900 which is coupled to host bus 902. A level two (L2) cache memory 904 is also coupled to host bus 902. Host-to-PCI bridge 906 is coupled to main memory 908, includes cache memory and main memory control functions, and provides bus control to handle transfers among PCI bus 910, processor 900, L2 cache 904, main memory 908, and host bus 902. Main memory 908 is coupled to Host-to-PCI bridge 906 as well as host bus 902. Devices used solely by host processor(s) 900, such as LAN card 930, are coupled to PCI bus 910. Service Processor Interface and ISA Access Pass-through 912 provides an interface between PCI bus 910 and PCI bus 914. In this manner, PCI bus 914 is insulated from PCI bus 910. Devices, such as flash memory 918, are coupled to PCI bus 914. In one implementation, flash memory 918 includes BIOS code that incorporates the necessary processor executable code for a variety of low-level system functions and system boot functions.

PCI bus 914 provides an interface for a variety of devices that are shared by host processor(s) 900 and Service Processor 916 including, for example, flash memory 918. PCI-to-ISA bridge 935 provides bus control to handle transfers between PCI bus 914 and ISA bus 940, universal serial bus (USB) functionality 945, power management functionality 955, and can include other functional elements not shown, such as a real-time clock (RTC), DMA control, interrupt support, and system management bus support. Nonvolatile RAM 920 is attached to ISA Bus 940. Service Processor 916 includes JTAG and I2C busses 922 for communication with processor(s) 900 during initialization steps. JTAG/I2C busses 922 are also coupled to L2 cache 904, Host-to-PCI bridge 906, and main memory 908 providing a communications path between the processor, the Service Processor, the L2 cache, the Host-to-PCI bridge, and the main memory. Service Processor 916 also has access to system power resources for powering down information handling device 901.

Peripheral devices and input/output (I/O) devices can be attached to various interfaces (e.g., parallel interface 962, serial interface 964, keyboard interface 968, and mouse interface 970 coupled to ISA bus 940. Alternatively, many I/O devices can be accommodated by a super I/O controller (not shown) attached to ISA bus 940.

In order to attach computer system 901 to another computer system to copy files over a network, LAN card 930 is coupled to PCI bus 910. Similarly, to connect computer system 901 to an ISP to connect to the Internet using a telephone line connection, modem 995 is connected to serial port 964 and PCI-to-ISA Bridge 935.

While FIG. 9 shows one information handling system that employs processor(s) 900, the information handling system may take many forms. For example, information handling system 901 may take the form of a desktop, server, portable, laptop, notebook, or other form factor computer or data processing system. Information handling system 901 may also take other form factors such as a personal digital assistant (PDA), a gaming device, ATM machine, a portable telephone device, a communication device or other devices that include a processor and memory.

One of the preferred implementations of the invention is a client application, namely, a set of instructions (program code) in a code module that may, for example, be resident in the random access memory of the computer. Until required by the computer, the set of instructions may be stored in another computer memory, for example, in a hard disk drive, or in a removable memory such as an optical disk (for eventual use in a CD ROM) or floppy disk (for eventual use in a floppy disk drive), or downloaded via the Internet or other computer network. Thus, the present invention may be implemented as a computer program product for use in a computer. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps.

While particular embodiments of the present invention have been shown and described, it will be obvious to those skilled in the art that, based upon the teachings herein, that changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

What is claimed is:

1. A method comprising:
loading a device model into an emulation system, the device model used to emulate design logic of a device;
loading an attached memory model into the emulation system, wherein the attached memory model is not part of the device model and not used to emulate any portion of the design logic;
loading an exerciser application into memory associated with the device model;
emulating the device using the device model by clocking the device model, the emulating resulting in execution of the exerciser application on the device model;
stopping the clocking of the device model in response to determining that the device model is at a lighthouse position, wherein the lighthouse position is at a point that corresponds to a plurality of explorable execution paths in the device model;
providing external stimuli data to the device model in response to determining that the device model is at the lighthouse position, wherein the external stimuli data is data that simulates user interaction with an operating system command line interface, the external stimuli data utilized by the device model to select a path from the lighthouse position;

re-clocking the device model and the attached memory model, which results in the exerciser application processing the external stimuli data;

gathering emulation data from the device model that the device model generated in response to the exerciser application processing the external stimuli data;

indicating an emulation test pass result in response to determining that the emulation data is correct based upon the external stimuli data; and indicating an emulation test fail result in response to determining that the emulation data is incorrect based upon the external stimuli data.

2. The method of claim 1 further comprising:

loading a runtime software environment into the emulation system;

loading, using the runtime software environment, seed data into the memory;

clocking the device model and the attached memory model, which results in transferring the seed data from the memory into the device model, wherein the exerciser application loads the seed data into a random generator; and performing the emulating using the seed data included in the random generator, the emulating resulting in an emulation state.

3. The method of claim 2 further comprising:

reading the emulation state from the device model using the runtime software environment;

in response the reading, determining by the runtime software environment whether the emulation state includes an exerciser application flagged error;

in response to determining that the emulation state includes the exerciser application flagged error, indicating, by the runtime software environment, the emulation test fail result; and in response to determining that the emulation state does not include the exerciser application flagged error, indicating, by the runtime software environment, the emulation test pass result.

4. The method of claim 1 wherein the external stimuli data is generated by the runtime software environment.

5. The method of claim 1 further comprising:

collecting thermal noise corresponding to a processor;

generating different external stimuli data based upon the collected thermal noise; and providing the different external stimuli data to the device model.

6. A computer program product stored on a non-transitory computer readable media, the computer readable media containing instructions for execution by a computer, which, when executed by the computer, cause the computer to implement a method for providing emulation data to a device model, the method comprising:

loading the device model into an emulation system, the device model used to emulate design logic of a device;

loading an attached memory model into the emulation system, wherein the attached memory model is not part of the device model and not used to emulate any portion of the design logic;

loading an exerciser application into memory associated with the device model;

emulating the device using the device model by clocking the device model, the emulating resulting in execution of the exerciser application on the device model;

stopping the clocking of the device model in response to determining that the device model is at a lighthouse position, wherein the lighthouse position is at a point that corresponds to a plurality of explorable execution paths in the device model;

providing external stimuli data to the device model in response to determining that the device model is at the lighthouse position, wherein the external stimuli data is data that simulates user interaction with an operating system command line interface, the external stimuli data utilized by the device model to select a path from the lighthouse position;

re-clocking the device model and the attached memory model, which results in the exerciser application processing the external stimuli data;

gathering emulation data from the device model that the device model generated in response to the exerciser application processing the external stimuli data;

indicating an emulation test pass result in response to determining that the emulation data is correct based upon the external stimuli data; and indicating an emulation test fail result in response to determining that the emulation data is incorrect based upon the external stimuli data.

7. The computer program product of claim 6 further comprising:

loading a runtime software environment into the emulation system;

loading, using the runtime software environment, seed data into the memory;

clocking the device model and the attached memory model, which results in transferring the seed data from the memory into the device model, wherein the exerciser application loads the seed data into a random generator; and performing the emulating using the seed data included in the random generator, the emulating resulting in an emulation state.

8. The computer program product of claim 7 further comprising:

reading the emulation state from the device model using the runtime software environment;

in response the reading, determining by the runtime software environment whether the emulation state includes an exerciser application flagged error;

in response to determining that the emulation state includes the exerciser application flagged error, indicating, by the runtime software environment, the emulation test fail result; and in response to determining that the emulation state does not include the exerciser application flagged error, indicating, by the runtime software environment, the emulation test pass result.

9. The computer program product of claim 6 wherein the external stimuli data is generated by the runtime software environment.

10. The computer program product of claim 7 wherein the method further comprises:

collecting thermal noise corresponding to a processor;

generating different external stimuli data based upon the collected thermal noise; and providing the different external stimuli data to the device model.

11. An information handling system comprising:

one or more processors;

a memory accessible by the processors;

one or more nonvolatile storage devices accessible by the processors; and an emulation tool for providing emulation data to a device model, the emulation tool being effective to:

load the device model into an emulation system located in the memory, the device model used to emulate design logic of a device;

load an attached memory model into the emulation system located in the memory, wherein the attached memory model is not part of the device model and not used to emulate any portion of the design logic;

load an exerciser application into the memory;

emulate the device using the device model by clocking the device model, the emulating resulting in execution of the exerciser application on the device model;

stop the clocking of the device model in response to determining that the device model is at a lighthouse position, wherein the lighthouse position is at a point that corresponds to a plurality of explorable execution paths in the device model;

provide external stimuli data to the device model in response to determining that the device model is at the lighthouse position, wherein the external stimuli data is data that simulates user interaction with an operating system command line interface, the external stimuli data utilized by the device model to select a path from the lighthouse position;

re-clock the device model and the attached memory model, which results in the exerciser application processing the external stimuli data;

gather emulation data from the device model that the device model generated in response to the exerciser application processing the external stimuli data;

indicate an emulation test pass result in response to determining that the emulation data is correct based upon the external stimuli data; and indicate an emulation test fail result in response to determining that the emulation data is incorrect based upon the external stimuli data.

12. The information handling system of claim 11 wherein the emulation tool is further effective to:

load a runtime software environment into the emulation system;

load, using the runtime software environment, seed data into the memory;

clock the device model and the attached memory model, which results in transferring the seed data from the memory into the device model, wherein the exerciser application loads the seed data into a random generator; and perform the emulating using the seed data included in the random generator, the emulating resulting in an emulation state.

13. The information handling system of claim 12 wherein the emulation tool is further effective to:

read the emulation state from the device model using the runtime software environment;

in response the reading, determine by the runtime software environment whether the emulation state includes an exerciser application flagged error;

in response to determining that the emulation state includes the exerciser application flagged error, indicate, by the runtime software environment, the emulation test fail result; and in response to determining that the emulation state does not include the exerciser application flagged error, indicate, by the runtime software environment, the emulation test pass result.

14. The information handling system of claim 11 wherein the external stimuli data is generated by the runtime software environment.

15. The information handling system of claim 11 wherein the emulation tool is further effective to:

collect thermal noise corresponding to one of the processors;

generate different external stimuli data based upon the collected thermal noise; and provide the different external stimuli data to the device model.

\* \* \* \* \*